United States Patent
Cho et al.

(10) Patent No.: US 11,041,914 B2
(45) Date of Patent: Jun. 22, 2021

(54) BATTERY CONTROL APPARATUS AND METHOD FOR DETECTION INTERNAL SHORT OF BATTERY

(71) Applicant: Samsung SDI Co., Ltd., Yongin-si (KR)

(72) Inventors: Young Shin Cho, Yongin-si (KR); Yoonphil Eo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 28 days.

(21) Appl. No.: 16/538,635

(22) Filed: Aug. 12, 2019

(65) Prior Publication Data
US 2020/0049773 A1 Feb. 13, 2020

(30) Foreign Application Priority Data

Aug. 13, 2018 (KR) .................. 10-2018-0094543
Jul. 22, 2019 (KR) .................. 10-2019-0088298

(51) Int. Cl.
*G01R 31/392* (2019.01)
*G01R 31/3842* (2019.01)
*H02J 7/00* (2006.01)

(52) U.S. Cl.
CPC ....... *G01R 31/392* (2019.01); *G01R 31/3842* (2019.01); *H02J 7/0031* (2013.01)

(58) Field of Classification Search
None
See application file for complete search history.

(56) References Cited

U.S. PATENT DOCUMENTS

| 2002/0109506 A1 | 8/2002 | Kawakami et al. |
| 2006/0186859 A1* | 8/2006 | Fujikawa ............... G01R 31/50 320/134 |
| 2009/0155674 A1 | 6/2009 | Ikeuchi et al. |
| 2010/0188054 A1 | 7/2010 | Asakura et al. |

(Continued)

FOREIGN PATENT DOCUMENTS

| CN | 102369627 A | 3/2012 |
| EP | 2073031 A2 | 6/2009 |

(Continued)

OTHER PUBLICATIONS

EPO Extended Search Report dated Dec. 3, 2019, for corresponding European Patent Application No. 19191310.2 (9 pages).

(Continued)

*Primary Examiner* — Jas A Sanghera
(74) *Attorney, Agent, or Firm* — Lewis Roca Rothgerber Christie LLP

(57) ABSTRACT

In a method for detecting an internal short of a battery, the method includes: acquiring first charge state information related to a charge state of the battery; detecting a first reference time point when the first charge state information satisfies a reference condition; acquiring second charge state information related to the charge state of the battery; detecting a second reference time point when the second charge state information satisfies a reference condition; and detecting an internal short of the battery based on a difference between a charge amount from the first reference time point to the second reference time point and a discharge amount from the first reference time point to the second reference time point.

30 Claims, 4 Drawing Sheets

(56) References Cited

U.S. PATENT DOCUMENTS

| | | |
|---|---|---|
| 2010/0194398 A1 | 8/2010 | Kawasumi et al. |
| 2011/0148426 A1 | 6/2011 | Yokotani |
| 2012/0004873 A1* | 1/2012 | Li ................ G01R 31/50 |
| | | 702/63 |
| 2012/0169288 A1 | 7/2012 | Ueki et al. |
| 2013/0080096 A1* | 3/2013 | Toki ............ G01R 31/389 |
| | | 702/63 |
| 2018/0172770 A1 | 6/2018 | Sun et al. |

FOREIGN PATENT DOCUMENTS

| | | |
|---|---|---|
| EP | 2343558 A2 | 7/2011 |
| EP | 2403105 A2 | 1/2012 |
| JP | 2009-204401 A | 9/2009 |
| JP | 2011-135656 A | 7/2011 |
| JP | 5289083 B2 | 9/2013 |
| JP | 5652802 B2 | 1/2015 |
| KR | 10-0534818 B1 | 12/2005 |
| KR | 10-2010-0050514 A | 5/2010 |
| KR | 10-1536220 B1 | 7/2015 |
| TW | 200928392 A | 7/2009 |
| TW | 201203779 A1 | 1/2012 |
| TW | I627813 B | 6/2018 |

OTHER PUBLICATIONS

Taiwanese Office Action dated Apr. 30, 2020, for corresponding Taiwanese Patent Application No. 108128516 (9 pages).

Korean Notice of Allowance dated dated Feb. 2, 2021, issued in corresponding Korean Patent Application No. 10-2019-0088298 (5 pages).

\* cited by examiner

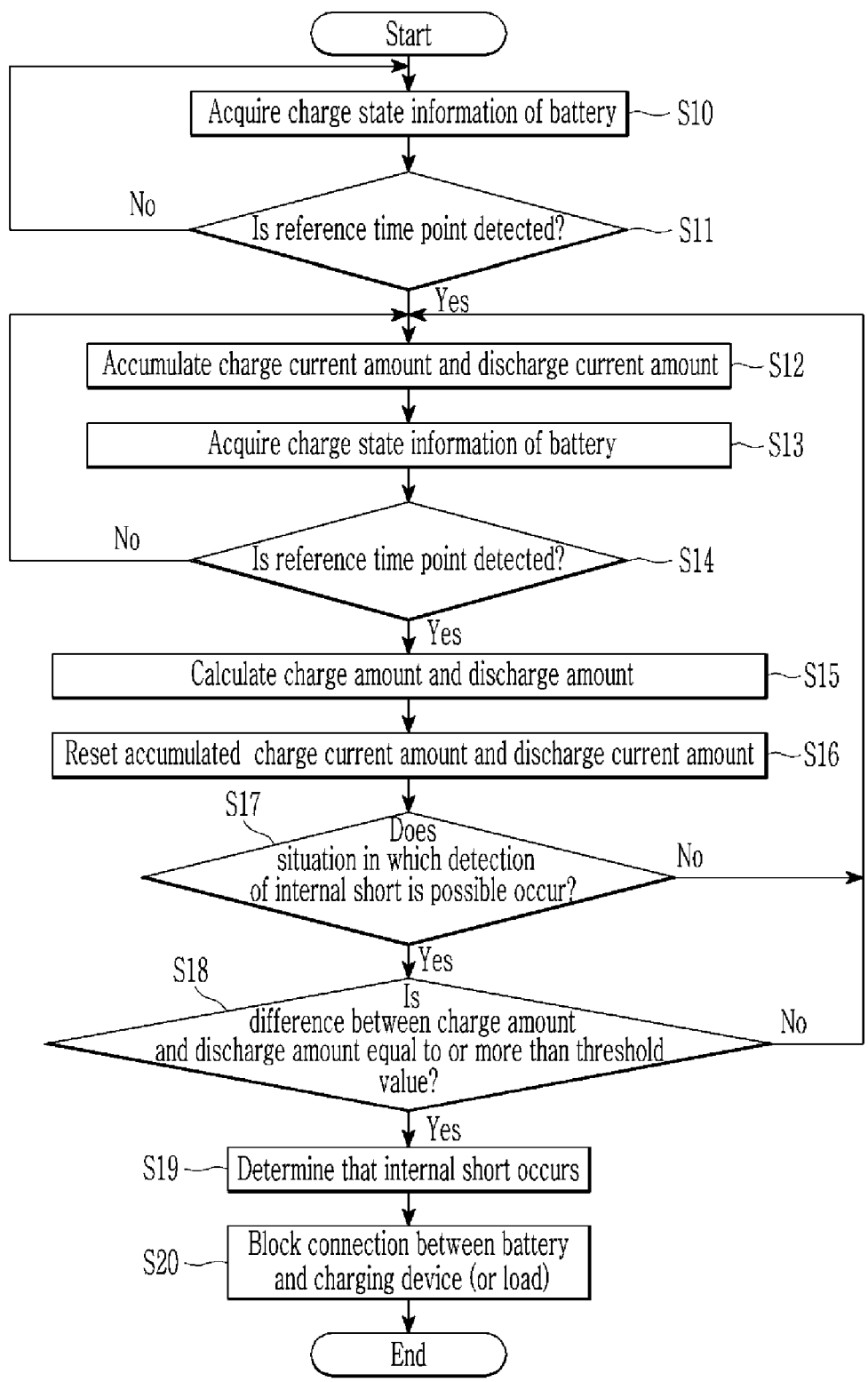

BATTERY CONTROL APPARATUS AND METHOD FOR DETECTION INTERNAL SHORT OF BATTERY

CROSS-REFERENCE TO RELATED APPLICATION

This application claims priority to and the benefit of Korean Patent Application No. 10-2018-0094543 filed in the Korean Intellectual Property Office on Aug. 13, 2018, and Korean Patent Application No. 10-2019-0088298 filed in the Korean Intellectual Property Office on Jul. 22, 2019, the entire contents of each of which are incorporated herein by reference.

BACKGROUND

1. Field

An example embodiment of the present invention relates to a battery control apparatus and a method for detecting an internal short of a battery.

2. Description of the Related Art

As the electric and electronic technology is developed, use of portable electronic products, which are small and light, and have various functions, is sharply increasing. A battery is generally used as a power supply device for an operation of a portable electronic product, and a rechargeable battery, which is charged and is re-usable, is mainly used.

The rechargeable battery is a chargeable and dischargeable battery, unlike a primary battery that cannot be charged. The rechargeable battery is used in a portable small electronic device, such as a portable phone or a notebook computer, or is widely used as a power source for driving a motor of a power tool, a vehicle, and the like. An internal part of the rechargeable battery may be formed of a positive electrode, a negative electrode, a separation film, an electrolyte, and the like, and a case may be formed of a metal plate or a pouch.

A rechargeable battery having high energy density may cause a problem in safety, such as thermal runaway, and particularly, the case where the positive electrode and the negative electrode inside the rechargeable battery are shorted, so that the rechargeable battery is overheated is a representative example. The internal short is caused from a loss of a function of the separation film, and examples thereof include deformation by an external impact, metallic foreign substances included in a manufacturing process, and the forming of dendrite of lithium or copper by an electrochemical reaction.

In the related art, a technology of detecting a state of an internal short of a rechargeable battery in advance and preventing the internal short is developed. In the scheme in the related art, a check time of several tens of minutes or more is required in the state where a voltage of the rechargeable battery is very stable (no load or very low load). Accordingly, it may be difficult to detect the internal short generated in the state where the rechargeable battery is continuously charged or discharged.

The above information disclosed in this Background section is only for enhancement of understanding of the background of the invention and therefore the information in this Background section does not necessarily constitute prior art.

SUMMARY

Some example embodiments include a battery control apparatus and a method for detecting an internal short of a battery which are capable of preventing thermal runaway due to an internal short of a battery by effectively detecting the internal short of the battery.

An example embodiment of the present invention provides a method for detecting an internal short of a battery, which may include: acquiring first charge state information related to a charge state of the battery; detecting a first reference time point when the first charge state information satisfies a reference condition; acquiring second charge state information related to the charge state of the battery; detecting a second reference time point when the second charge state information satisfies a reference condition; and detecting an internal short of the battery based on a difference between a charge amount from the first reference time point to the second reference time point and a discharge amount from the first reference time point to the second reference time point.

The detecting of the internal short may include determining that the internal short occurs in the battery when the difference between the charge amount and the discharge amount is equal to or more than a threshold value.

Each of the first charge state information and the second charge state information may include a state of charge (SOC) of the battery, and the reference condition may include a reference SOC.

The reference condition may include a full charge condition. In the example embodiment, each of the first charge state information and the second charge state information may include a current value and a voltage value of the battery, respectively and the full charge condition may include a reference current value and a reference voltage value. Further, the detecting of the first reference time point may include detecting the first reference time point when the current value of the battery included in the first charge state information is equal to or less than the reference current value and the voltage value of the battery included in the first charge state information is equal to or more than the reference voltage value, and the detecting of the second reference time point may include detecting the first reference time point when the current value of the battery included in the second charge state information is equal to or less than the reference current value and the voltage value of the battery included in the second charge state information is equal to or more than the reference voltage value.

The method may further include determining whether the first charge state information and the second charge state information are similar to each other within a predetermined range, in which the detecting of the internal short may be performed when the first charge state information and the second charge state information are similar to each other within the predetermined range.

The method may further include determining whether the charge amount and the discharge amount are equal to or more than a predetermined value, in which the detecting of the internal short may be performed when at least one of the charge amount and the discharge amount is equal to or more than the predetermined value.

The method may further include determining whether a time interval between the first reference time point and the second reference time point is within a threshold range, in which the detecting of the internal short may be performed when the time interval is within the threshold range.

The threshold range may be a maximum of 48 hours.

The method may further include: accumulating a charge current amount supplied from a charging device to the battery and a discharge current amount supplied from the battery to a load as the first reference time point is detected; and calculating the charge amount and the discharge amount based on the accumulated charge current amount and discharge current amount when the second reference time point is detected.

The method may further include resetting the accumulated charge current amount and discharge current amount after the calculating of the charge amount and the discharge amount.

Another example embodiment of the present invention provides a battery control apparatus which may include: a measurement unit configured to measure a voltage, a current, and a temperature of the battery; a detector acquiring charge state information related to a charge state of the battery based on at least one of a voltage value, a current value, and a temperature value of the battery measured by the measurement unit and detecting reference time points when the charge state information satisfies a reference condition; an accumulator accumulating a charge current amount and a discharge current amount of the battery until a second reference time point is detected by the detector and calculating a charge amount and a discharge amount of the battery based on the accumulated charge current amount and discharge current amount; and an internal short detector detecting an internal short of the battery based on a difference between the charge amount from the first reference time point to the second reference time point and the discharge amount from the first reference time point to the second reference time point.

The internal short detector may determine that the internal short occurs in the battery when the difference between the charge amount and the discharge amount is equal to or more than a threshold value.

The charge state information may include an SOC of the battery, and the reference condition may include a reference SOC.

The reference condition may include a full charge condition. In the example embodiment, the charge state information may include a current value and a voltage value of the battery and the full charge condition may include a reference current value and a reference voltage value. Further, the detector may detect the reference time point when the current value of the battery is equal to or less than the reference current value and the voltage value of the battery is equal to or more than the reference voltage value.

The internal short detector may detect the internal short based on the difference between the charge amount and the discharge amount when the charge state information of the battery at the first reference time point and the charge state information of the battery at the second reference time point are similar to each other within a predetermined range.

The internal short detector may detect the internal short based on the difference between the charge amount and the discharge amount when the charge amount and the discharge amount are equal to or more than a predetermined value.

The internal short detector may detect the internal short based on the difference between the charge amount and the discharge amount when a time interval between the first reference time point and the second reference time point is within a threshold range.

The threshold range may be a maximum of 48 hours.

According to an example embodiment of the present invention, there is an effect in that an internal short of a battery can be effectively detected and thermal runaway of the battery can be prevented.

BRIEF DESCRIPTION OF THE DRAWINGS

FIG. 4 is a flowchart illustrating a method for detecting an internal short of a battery of a battery control apparatus according to an example embodiment of the present invention.

DETAILED DESCRIPTION

Hereinafter, a battery control apparatus according to an example embodiment of the present invention will be described in more detail with reference to FIGS. 1 to 3.

Figure 1:
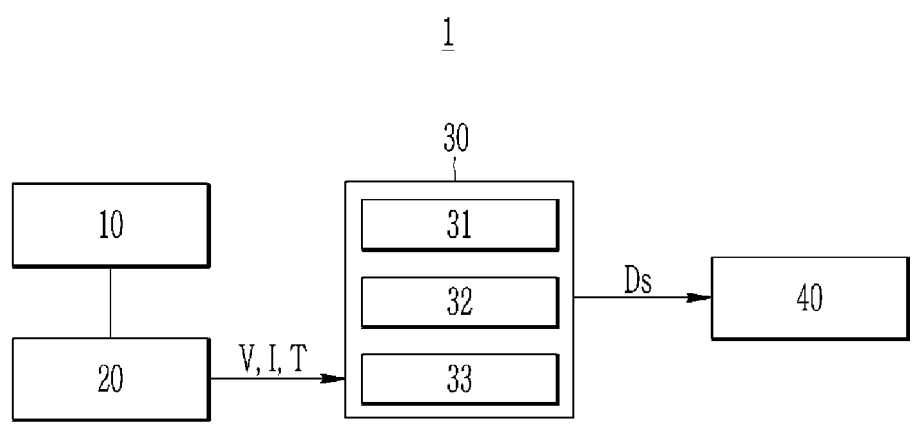
FIG. 1 is a block diagram illustrating a configuration of a battery control device according to an example embodiment of the present invention.
Figure 2:
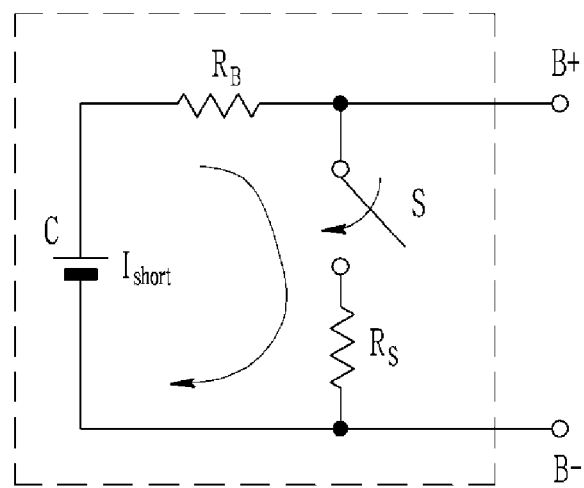
FIG. 2 is an equivalent circuit of a battery according to the example embodiment of the present invention.

FIG. 1 is a block diagram illustrating a configuration of a battery control apparatus according to an example embodiment of the present invention and FIG. 2 is an equivalent circuit of a battery according to the example embodiment of the present invention.

Referring to FIG. 1, a battery control apparatus 1 according to an example embodiment of the present invention may include a battery 10, a measurement unit 20, a detection unit 30, and a control unit 40 and may prevent thermal runaway of the battery by sensing the internal short of the battery 10.

The battery 10 as a secondary battery which is chargeable and dischargeable may be referred to as a cell.

Referring to FIG. 2, the battery 10 may include two terminals B+ and B− and may be charged by an external charging device (not illustrated) or discharged by an external load (not illustrated) through the two terminals B+ and B−. For convenience of the description, it is described that the charging device is provided outside the battery control device 1, but the example embodiment of the present invention is not limited thereto.

As illustrated in FIG. 2, the battery 10 may include an internal resistance $R_B$, and the internal resistance $R_B$ may have a resistance value of several mΩ to several hundreds of mΩ. When an internal short is generated in the battery 10, the same effect as an effect in that a switch S inside the battery 10 is electrically connected is generated When the switch S is electrically connected, a short current $I_{short}$ flows in a short resistance $R_s$, so that the battery 10 is discharged. In this case, the short resistance $R_s$ may have a resistance value of a broad range of several mΩ to several kΩ.

The battery 10 is charged by one or more charging methods among constant current (CC) charging, in which the battery is charged with a constant current from an initial stage to a completion stage of the charging, constant voltage (CV) charging, in which the battery is charged with a constant voltage from an initial stage to a completion state of the charging, and CC-CV charging, in which the battery is charged with a constant current at an initial stage of the charging and is charged with a constant voltage at a completion stage of the charging. The CC charging is a charging method for supplying constant current to the battery 10 and charging the battery 10 until the battery 10 reaches a predetermined set voltage. The voltage of the battery 10 may be raised together with the charge amount of the battery 10 while the CC charging is performed. In the present specification, the charge amount indicates the amount of electric charge or capacitance (or capacity) that a charging device (not illustrated) supplies to the battery 10 to charge the battery 10, and is different from a state of charge (SOC) indicating a charge level. Further, the discharge amount means the amount of electric charge or capacitance supplied from the battery 10 to a load (not illustrated).

When the charging and discharging of the battery 10 are repeated under the same condition, a charge amount between fully charged time points of the battery 10, that is, until the battery 10 is fully charged again, after the battery 10 is fully charged and then discharged is slightly larger than the discharge amount. Such a difference is due to various energy loss including heat generation, self-discharge, etc., of the battery 10 during the progress of charging/discharging.

When the internal short occurs in the battery 10, the short current $I_{short}$ is generated as illustrated in FIG. 2 and this causes energy loss by the short resistance Rs in the battery. Therefore, when the internal short occurs in the battery 10, the amount of electric charge (discharge amount) which the battery 10 may supply to the load (not illustrated) compared with the amount of electric charge (charge amount) which the charging device (not illustrated) may supply to the battery 10 is significantly smaller than that at before the internal short occurs. That is, in the battery 10 in which the internal short occurs, some of the amount of electric charge (charge amount) supplied by the charging device for charging the battery 10 during charging is consumed by an internal short path including the short resistance Rs, the amount of electric charge actually accumulated in the battery 10 compared with the amount of electric charge supplied from the charging device is smaller than that before the internal short occurs. Further, in the battery 10 in which the internal short occurs, energy is consumed by the internal short path including the short resistance Rs at the time of discharging, and as a result, the amount of electric charge supplied from the battery 10 to the external load compared with the amount of electric charge actually discharged by the battery 10 is smaller than that before the internal short occurs.

Referring to such a characteristic, the battery control apparatus 1 according to the example embodiment monitors the charge amount and the discharge amount of the battery 10 to detect the internal short of the battery 10. A detailed configuration of detecting the internal short of the battery 10 by monitoring the charge amount and the discharge amount of the battery 10 will be described below.

The measurement unit 20 continuously measures a voltage V, a current I, and a temperature T of the battery 10 and transfers the measured voltage value, current value, temperature value to the detection unit 30. In the present specification, the current I of the battery 10 indicates charge current supplied from a charging device (not illustrated) to the battery 10 or discharge current supplied from the battery 10 to an external load (not illustrated).

The detection unit 30 includes a detector 31, an accumulator 32, and an internal short detector 33 and monitors the charge amount and the discharge amount of the battery 10 and detects the internal short of the battery 10, and generates a short detection signal Ds.

The detector 31 acquires charge state information related to a charge state of the battery 10 from a temperature value, a voltage value, and a current value of the battery 10 received from the measurement unit 20 at the time of charging the battery 10. Here, the charge state information may include a temperature value, a voltage value, and a current value of the battery 10 measured by the measurement unit 20, or may include an SOC of the battery 10.

Further, the detector 31 detects a time point (hereinafter, referred to as a 'reference time point') when the charge state information of the battery 10 satisfies a predetermined reference condition.

In the detector 31, a reference condition used for detecting the reference time point may include a reference SOC. In this case, the detector 31 may detect a time point when the SOC of the battery 10 reaches a predetermined reference SOC as the reference time point. The reference SOC may be an SOC which becomes a reference for determining that the battery 10 is in a full charge state, but the example embodiments are not limited thereto, and as a result, the reference SOC may be set to a value which is lower or higher than the SOC which becomes the reference for determining the full charge state.

In the detector 31, the reference condition used for detecting the reference time point as a full charge condition of the battery 10 may include at least one condition for determining the full charge state of the battery 10.

As one example, the reference condition may include a reference voltage value and a reference current value for determining the full charge state of the battery 10. In this case, the detector 31 may detect a time point when the voltage value of the battery 10 is equal to or more than a reference voltage value and the current value of the battery 10 is equal to or less than a reference current value as the reference time point. The full charge condition may include other conditions other than the reference voltage value and the reference current value and this may vary depending on a scheme in which the battery control apparatus 1 determines the full charge state of the battery 10.

In the detector 31, the reference condition used for detecting the reference time point may include a reference voltage value and a reference current value for determining a predetermined state other than the full charge state of the battery 10. In this case, the reference voltage value and the reference current value may correspond to a voltage value and a current value which become a reference for determining whether the battery 10 reaches a predetermined charge state before or after the battery 10 reaches the full charge state. In this case, the detector 31 may detect a time point when the voltage value of the battery 10 is equal to or more than the reference voltage value and the current value of the battery 10 is equal to or less than the reference current value as the reference time point similarly to the detection of the full charge state.

The accumulator 32 accumulates the charge amount and the discharge amount of the battery 10 until a subsequent reference time point is detected when the reference time point is detected by the detector 31 to calculate the charge amount and the discharge amount of the battery 10 during a period (hereinafter, referred to and used as a 'comparison period') between both reference time points. Here, the accumulator 32 may accumulate charge current supplied from the charging device to the battery 10 during the comparison period and acquire the charge amount during the comparison period from the accumulated charge current amount and accumulate discharge current supplied from the battery 10 to the external load during the comparison period and acquire the discharge amount during the comparison period from the accumulated discharge current amount.

In such a scheme, the accumulator 32 may calculate the charge amount and the discharge amount for each of a plurality of comparison periods with two different reference time points as a start reference time point and an end reference time point, respectively. To this end, the accumulator 32 is reset when the reference time point is detected to reset the charge current amount and the discharge current amount accumulated during the previous comparison period and newly start accumulation of the charge current and the discharge current. The start reference time point of each comparison period may be the same as the end reference time point of the previous comparison period and the end reference time point may be the same as the start reference time point of the subsequent comparison period.

The accumulator 32 may be a single accumulator having a sign and may include two accumulators for accumulating the charge current amount and the discharge current amount, respectively, but the example embodiments are not limited thereto.

When the charge amount and the discharge amount during each comparison period are calculated by the accumulator 32, the internal short detector 33 detects the internal short IS of the battery 10 based on the calculated charge amount and discharge amount and transfers a detection signal Ds including information on whether the internal short IS occurs to the control unit 40.

The control unit 40 may control connection or disconnection of an external charging apparatus (not illustrated) or a load (not illustrated) connected to the battery 10 based on the detection signal Ds received from the internal short detector 33. For example, the control unit 40 may interrupt the connection of the external charging apparatus (not illustrated) or the load (not illustrated) connected to the battery 10 when the detection signal Ds indicating the occurrence of the internal short of the battery 10 is generated by the internal short detector 33

Accordingly, the battery control apparatus 1 may detect the internal short of the battery 10 and control the connection between the battery 10 and a charging apparatus (or load) according to a detection result of the internal short, thereby preventing thermal runaway of the battery 10 due to the internal short As described above, when the internal short of the battery 10 is to be detected by comparing the charge amount and the discharge amount of the battery 10 during a comparison period having a start reference time point and an end reference time point, the amount of electric charge (or SOC) held by the battery 10 at the start reference time point of the comparison period and the amount of electric charge (or SOC) held by the battery 10 at the end reference time point need to be equal to each other or similar to each other at a predetermined level or higher. This is because the difference between the amount of electric charge held by the battery 10 at the start reference time point of the comparison period and the amount of electric charge held by the battery 10 at the end reference time point of the comparison period influences the difference between the charge amount and the discharge amount of the battery 10 during the comparison period in addition to the internal short, and as a result, it is difficult to detect the internal short by comparing the charge amount and the discharge amount.

Therefore, the battery control apparatus 1 sets a reference condition so as to detect a time when the charge state of the battery 10 reaches a state (for example, a full charge state) in which the amount of electric charge held by the battery 10 is determined to have a predetermined value consistently with the start reference time point and the end reference time point of the comparison period In addition, when the internal short detector 33 determines the charge state of the battery 10 at the start reference time point and the charge state of the battery 10 at the end reference time point for one comparison period are different from each other at a predetermined level or higher due to a change in surrounding environment of the battery 10, the internal short detector 33 may omit detection of the internal short. For example, when the full charge condition for determining the full charge state of the battery 10 is set to be changed in accordance with the change of the surrounding environment such as a temperature, etc., the full charge conditions at the start reference time point and the end reference time point for one comparison period may be different from each other. Accordingly, the internal short detector 33 compares charge state information (e.g., a voltage value, a current value, a temperature value, etc.) of the battery 10 at the start reference time point of the comparison period and charge state information (e.g., the voltage value, the current value, the temperature value, etc.) at the end reference time point with each other to determine whether to detect the internal short.

Further, the internal short detector 33 may detect the internal short by comparing the charge amount and the discharge amount only when at least one of the charge amount and the discharge amount generated during the comparison period is equal to or greater than a predetermined value. This is because, if the charge amount and the discharge amount during the comparison period are too small, the difference between the charge amount and the discharge amount due to the internal short is insignificant, and the reliability of the internal short detection is lowered.

Further, the internal short detector 33 compares the charge amount and the discharge amount with each other to detect the internal short only when the length of the comparison period, that is, a time interval between the start reference time point and the end reference time point of the comparison period is within a predetermined threshold range. This is to prevent detection reliability from being lowered due to detection of the internal short in a situation in which information of the accumulator 32 because the time interval between the start reference time point and the end reference time point is too short so that the difference between the charge amount and the discharge amount due to the internal short is insignificant or the time interval between the start reference time point and the end reference time point is too long so that the information of the accumulator 32 may not be reliable. Therefore, the internal short detector 33 sets a threshold range so as to set a minimum time for generating the difference between the charge amount and the discharge amount due to the internal short to a detectable level as a minimum value and set a maximum time for securing the reliability of the accumulator 32 to a predetermined level or higher as a maximum value and compares the charge amount and the discharge amount to detect the internal short by comparing the charge amount and the discharge amount only when the length (the time interval between the start reference time point and the end reference time point) of the comparison period is within a threshold range. The threshold range may be set to a minimum of 2 hours within a maximum of 48 hours, but the example embodiments are not limited thereto.

Hereinafter, a method for detecting the internal short $I_S$ of the battery 10 by the battery control apparatus 1 will be described with reference to FIG. 3

Figure 3:
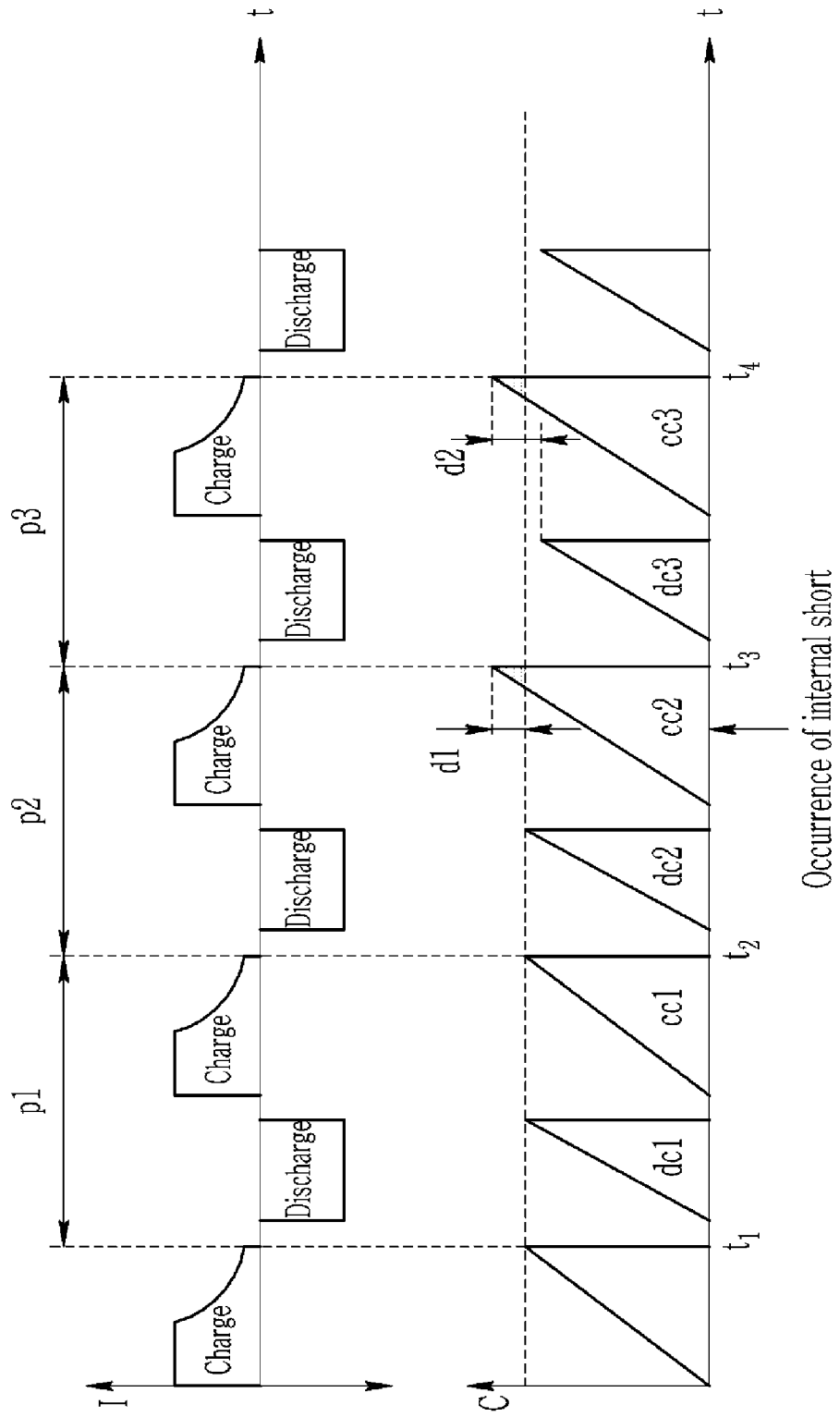
FIG. 3 is a graph showing changes in a charge amount and discharge amount depending on occurrence of an internal short of a battery.

FIG. 3 is a graph schematically showing changes in a charge amount and a discharge amount depending on occurrence of an internal short of a battery 10, and illustrates a case where the battery 10 is repeatedly charged and discharged by a CC-CV charging method and a CC discharging method as an example.

In the graphs of FIG. 3, t denotes time, I denotes a charge current supplied from the charging device to the battery 10 or a discharge current supplied from the battery 10 to the load, and C denotes a charge amount or a discharge amount. Referring to FIG. 3, the charge amount of the battery 10 continuously increases while the charge current is supplied to the battery 10, and the discharging amount of the battery 10 continuously increases while the discharging current is supplied from the battery 10.

In FIG. 3 as an example, the detector 31 acquires information on the charge state of the battery 10 using the information obtained through the measurement unit 20, and detects a plurality of time points when the charge state information of the battery 10 satisfies the full charge condition as reference time points t1, t2, t3, and t4. Further, the detector 31 stores the information on the charge state of the battery 10 at the corresponding time point in a memory whenever the reference time points t1, t2, t3, and t4 are detected.

When the reference time points t1, t2, t3 and t4 are detected, the accumulator 32 calculates charge amounts cc1, cc2, and cc3 and discharge amounts dc1, dc2, and dc3 with respect to a plurality of comparison periods p1, p2, and p3 which set each of the reference time points t1, t2, t3, and t4 as a start reference time point or an end reference time point. The accumulator 32 may calculate the charge amount and the discharge amount during each of the comparison periods p1, p2, and p3 by accumulating the charge current and the discharge current for each of the plurality of comparison periods p1, p2, and p3.

Specifically, when the reference time point t1 is detected, the accumulator 32 then accumulates each of the charge current amount and the discharge current amount until the reference time point t2 is detected. In addition, when the reference time point t2 is detected, the charge amount cc1 and the discharge amount dc1 of the comparison period p1 are calculated from the charge current amount and the discharge current amount accumulated from the reference time point t1 to the reference time point t2. Further, the charge current amount and the discharge current amount accumulated so far are reset, and the charge current amount and the discharge current amount are then respectively accumulated until the reference time point t3 is detected after the start of new accumulation In addition, when the reference time point t3 is detected, the charge amount cc2 and the discharge amount dc2 of the comparison period p2 are calculated from the charge current amount and the discharge current amount accumulated from the reference time point t2 to the reference time point t3. Further, the charge current amount and the discharge current amount accumulated so far are reset, and the charge current amount and the discharge current amount are then respectively accumulated until the reference time point t4 is detected after the start of new accumulation In addition, when the reference time point t4 is detected, the charge amount cc3 and the discharge amount dc3 of the comparison period p3 are calculated from the charge current amount and the discharge current amount accumulated from the reference time point t3 to the reference time point t4.

In this scheme, the internal short detector 33 compares the calculated charge amount and discharge amount each time the charge amount and the discharge amount in each of the comparison periods p1, p2, and p3 are calculated and when the difference between the charge amount and the discharge amount is equal to or more than the threshold value, it is determined that the internal short occurs. In addition to the internal short, the energy of the battery 10 is lost due to heat generation or the like while the charging/discharging of the battery 10 is in progress. However, the amount of energy lost in this case is insignificant and may be ignored by setting a threshold value appropriately when detecting the internal short. That is, the battery control apparatus 1 sets the threshold value used for internal short detection to a predetermined value or more so that it is erroneously determined that the energy loss due to factors other than the internal short is not occurs due to the internal short.

Taking FIG. 3 as an example, the comparison period p1 is a period before the internal short occurs, and the charge amount and the discharge amount during the comparison period p1 are very similar to each other.

Thereafter, the internal short occurs during the charging of the battery 10 in the comparison period p2, so that the charge amount cc2 in the comparison period p2 is larger than the charge amount cc1 in the comparison period p1 in which the battery 10 is in a normal state. Therefore, a difference d1 between the discharge amount dc2 and the charge amount cc2 during the comparison period p2 becomes equal to or larger than a threshold value and the internal short of the battery 10 may be detected by the internal short detector 33.

Thereafter, in the comparison period p3, charging and discharging are performed in a state in which the internal short occurs, so that the energy loss due to the internal short further increases. Accordingly, a difference d2 between the discharge amount dc3 and the charge amount cc3 during the comparison period p3 increases as compared with the difference during the previous comparison period p2. Thus, the internal short of the battery 10 is once again detected by the internal short detector 33.

In the battery control apparatus 1 described above, the measurement unit 20, the detection unit 30, or the control unit 40 may be performed by one or more central processing units (CPUs) or a processor implemented by other chipsets, microprocessors, etc.

Hereinafter, a battery control method according to an example embodiment of the present invention will be described with reference to FIG. 4.

FIG. 4 is a flowchart illustrating a method for detecting an internal short according to an example embodiment of the present invention The method for detecting the internal short in FIG. 4 may be performed by the battery control apparatus 1 described with reference to FIGS. 1 and 2.

Referring to FIG. 4, the detection unit 30 acquires the charge state information of the battery 10 (S10) and compares the charge state information with a reference condition to determine whether the reference time point when the charge state information of the battery 10 satisfies the reference condition (S11)

In step S10, the detection unit 30 receives results of measuring voltage, current, and a temperature of the battery 10 from the measurement unit 20 and acquires the charge state information related to a charge state of the battery 10 from the measurement results. Here, the charge state information may include a temperature value, a voltage value, and a current value of the battery 10 measured by the measurement unit 20, or may include an SOC of the battery 10.

In step S11, a reference time point is used as a start time point or an end time point of a comparison period, and the reference condition for detecting the reference time point may include a reference SOC, a full charge condition, or a reference voltage value and a reference current value.

The detection unit 30 repeatedly performs step S10 of acquiring the charge state information of the battery 10 until the reference time point is detected and step S11 of determining whether the reference time point is detected by comparing the charge state information with the reference condition. In addition, when the reference time point is detected through step S11, the detection unit 30 accumulates the charge current amount supplied from a charging device to the battery 10 and the discharge current amount supplied from the battery 10 to a load (S12). Further, the detection unit 30 acquires the charge state information of the battery 10 (S13) and determines whether the reference time point when the charge state information of the battery 10 satisfies the reference condition is detected by comparing the acquired charge state information with the reference condition (S14).

The detection unit 30 repeatedly performs step S12 of accumulating the charge current amount and the discharge current amount until the reference time point is detected, step S13 of acquiring the charge state information of the battery 10, and step S14 of determining whether the reference time point is detected by comparing the charge state information with the reference condition. In addition, when the reference time point is detected through step S14, the charge amount and the discharge amount of the battery 10 are calculated by using the charge current amount and the discharge current amount accumulated so far (S15). In addition, the charge current amount and the discharge current amount accumulated so far are reset by resetting the accumulator 32 (S16).

In step S15, the charge current amount and the discharge current amount accumulated from the reference time point detected through step S11 to the reference time point detected through step S14 are used in order to calculate the charge amount and the discharge amount. That is, in this case, in the comparison period in which the charge amount and the discharge amount are calculated, the start time point may become a reference time point detected through step S11 and the end time point may become a reference time point detected through step S14.

On the other hand, before detecting the internal short of the battery 10 by comparing the charge amount and the discharge amount in the comparison period, the detection unit 30 first checks whether a current situation is a state in which the internal short detection is possible in order to secure the detection reliability (S17). In addition, if it is determined that the current state is a state in which the internal short detection is possible, the charge amount and the discharge amount in the comparison period are compared and the process proceeds to step S18 for performing the internal short detection.

For example, the detection unit 30 checks in step S17 whether the charge state information (e.g., a voltage value, a current value, a temperature value, etc.) of the battery 10 at the time of detecting the reference time point through step S11 and the charge state information (e.g., the voltage value, the current value, the temperature value, and the like) of the battery 10 at the time of detecting the reference time point through S14 are similar to each other at a predetermined level or more and if both charge state information is similar at a predetermined level or more, the process may proceed to step S18. Specifically, the detection unit 30 may determine that the charge state information of the battery 10 at two reference time points is similar when the difference between the temperature value of the battery 10 at the reference time point detected through step S11 and the temperature value of the battery 10 at the reference time point detected through step S14 is equal to or less than a predetermined value, the difference between the current value of the battery 10 at the reference time point detected through step S11 and the current value of the battery 10 at the reference time point detected through step S14 is equal to or less than a predetermined value, and the difference between the voltage value of the battery 10 at the reference time point detected through step S11 and the voltage value of the battery 10 at the reference time point detected through step S14 is equal to or less than a predetermined value Further, for example, in step S17, the detection unit 30 may check whether at least one of the charge amount and the discharge amount from the reference time point detected through step S11 to the reference time point detected through step S14 is equal to or greater than a predetermined value and when at least one of the charge amount and the discharge amount is equal to or greater than the predetermined value, the process may proceed to step S18.

Further, for example, in step S17, the detection unit 30 may compares the length of the comparison period in which the reference time point detected through step S11 is set as the start time point and the reference time point detected through step S14 is set as the end time point with a threshold range (e.g., from a minimum of 2 hours to a maximum of 48 hours) and if the length of the comparison period is within the threshold range, the process may proceed to step S18.

In step 17, if all the conditions listed above as an example are satisfied, the detection unit 30 may proceed to step S18 of performing the internal short detection by comparing the charge amount and the discharge amount in the comparison period. However, since the example embodiments are not limited thereto, even if only some of the conditions listed above as an example are satisfied, the detection unit 30 may proceed to step S18 of performing the internal short detection by comparing the charge amount and the discharge amount in the comparison period.

Step S17 described above is to prevent the internal short detection from being performed in a situation in which the difference between the charge amount and the discharge amount calculated during the comparison period increases to a threshold value or more due to factors other than the internal short, the internal short detection from being performed in a situation in which the difference between the charge amount and the discharge amount by the internal short is not generated to the detectable level, or the internal short detection from being performed in a situation in which the reliability of the calculated charge amount and discharge amount is low.

When it is determined that a current situation is not a situation in which the internal short detection is possible through step S17, the detection unit 30 proceeds to step S12 to initiate accumulation of the charge current amount and the discharge current amount in a new comparison period. In this case, the reference time point previously detected through step S14 becomes the start time point of the new comparison period and the reference time point detected later becomes the end time point of the new comparison period.

If it is determined in step S17 that the current situation is a situation in which the internal short detection is possible, the detection unit 30 determines whether the difference between the charge amount and the discharge amount from the reference time point detected through step S11 to the reference time point detected through step S14 is equal to or more than the threshold value (S18). In addition, when the difference between the charge amount and the discharge amount is equal to or more than a threshold value, it is determined that the internal short occurs in the battery 10 (S19) and connection between the battery 10 and the charging device (not illustrated) or between the battery 10 and the load is blocked (S20) to prevent thermal runaway of the battery 10.

Meanwhile, in this specification, it is described as an example that the battery control apparatus 1 detects the internal short for one battery 10, but the example embodiments are not limited thereto. For example, the battery control apparatus 1 is capable of detecting the internal short of each battery by applying the internal short detecting method even to a battery module in which a plurality of batteries is configured to be connected in series and/or in parallel. In this case, the voltage value of the battery 10 may correspond to voltages of both terminals B+ and B− of the battery 10 and the current of the battery 10 may correspond to charge current supplied from the charging device to a battery module or discharge current supplied from the battery module to the load.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims, and their equivalents.

What is claimed is:

1. A method for detecting an internal short of a battery, the method comprising:
   acquiring first charge state information related to a charge state of the battery;
   detecting a first reference time point when the first charge state information satisfies a reference condition;
   acquiring second charge state information related to the charge state of the battery;
   detecting a second reference time point when the second charge state information satisfies the reference condition; and
   detecting an internal short of the battery based on a difference between a charge amount from the first reference time point to the second reference time point and a discharge amount from the first reference time point to the second reference time point.

2. The method of claim 1, wherein:
   the detecting of the internal short includes determining that the internal short occurs in the battery when the difference between the charge amount and the discharge amount is equal to or more than a threshold value.

3. The method of claim 1, wherein:
   each of the first charge state information and the second charge state information includes an SOC of the battery, and
   the reference condition includes a reference SOC.

4. The method of claim 1, wherein:
   the reference condition includes a full charge condition.

5. The method of claim 1, wherein:
   each of the first charge state information and the second charge state information includes a current value and a voltage value of the battery, respectively,
   the reference condition includes a reference current value and a reference voltage value,
   the detecting of the first reference time point includes detecting the first reference time point when the current value of the battery included in the first charge state information is equal to or less than the reference current value and the voltage value of the battery included in the first charge state information is equal to or more than the reference voltage value, and
   the detecting of the second reference time point includes detecting the second reference time point when the current value of the battery included in the second charge state information is equal to or less than the reference current value and the voltage value of the battery included in the second charge state information is equal to or more than the reference voltage value.

6. The method of claim 1, further comprising:
   determining whether the first charge state information and the second charge state information are within a predetermined range of each other,
   wherein the detecting of the internal short is performed when the first charge state information and the second charge state information are similar to each other within the predetermined range.

7. The method of claim 1, further comprising:
   determining whether or not at least one of the charge amount and the discharge amount is equal to or more than a predetermined value,
   wherein the detecting of the internal short is performed when at least one of the charge amount and the discharge amount is equal to or more than the predetermined value.

8. The method of claim 1, further comprising:
   determining whether or not a time interval between the first reference time point and the second reference time point is within a threshold range,
   wherein the detecting of the internal short is performed when the time interval is within the threshold range.

9. The method of claim 1, further comprising:
   accumulating a charge current amount supplied from a charging device to the battery and a discharge current amount supplied from the battery to a load as the first reference time point is detected; and
   calculating the charge amount and the discharge amount based on the accumulated charge current amount and the discharge current amount when the second reference time point is detected.

10. The method of claim 9, further comprising:
    resetting the accumulated charge current amount and the discharge current amount after the calculating of the charge amount and the discharge amount.

11. A battery control apparatus comprising:
    a measurement unit configured to measure a voltage, a current, and a temperature of a battery;
    a detector configured to acquire charge state information related to a charge state of the battery based on at least one of a voltage value, a current value, and a temperature value of the battery measured by the measurement unit and detecting first and second reference time points when the charge state information satisfies a reference condition;
    an accumulator configured to accumulate, when the first reference time point is detected by the detector, a charge current amount and a discharge current amount of the battery until the second reference time point is detected by the detector and calculating a charge amount and a discharge amount of the battery based on the accumulated charge current amount and the discharge current amount; and an internal short detector configured to detect an internal short of the battery based on a difference between the charge amount from the first reference time point to the second reference time point and the discharge amount from the first reference time point to the second reference time point.

12. The apparatus of claim 11, wherein:
the internal short detector is configured to determine that the internal short occurs in the battery when the difference between the charge amount and the discharge amount is equal to or more than a threshold value.

13. The apparatus of claim 11, wherein:
the charge state information includes an SOC of the battery, and
the reference condition includes a reference SOC.

14. The apparatus of claim 11, wherein:
the reference condition includes a full charge condition.

15. The apparatus of claim 11, wherein:
the charge state information includes a current value and a voltage value of the battery,
the reference condition includes a reference current value and a reference voltage value, and
the detector is configured to detect the first or second reference time point when the current value of the battery is equal to or less than the reference current value and the voltage value of the battery is equal to or more than the reference voltage value.

16. The apparatus of claim 12, wherein:
the internal short detector is configured to detect the internal short based on the difference between the charge amount and the discharge amount when the charge state information of the battery at the first reference time point and the charge state information of the battery at the second reference time point are within a predetermined range of each other.

17. The apparatus of claim 11, wherein:
the internal short detector is configured to detect the internal short based on the difference between the charge amount and the discharge amount when at least one of the charge amount and the discharge amount is equal to or more than a predetermined value.

18. The apparatus of claim 11, wherein:
the internal short detector is configured to detect the internal short based on the difference between the charge amount and the discharge amount when a time interval between the first reference time point and the second reference time point is within a threshold range.

19. A method for detecting an internal short of a battery, the method comprising:
detecting a first reference time point in response to first charge state information related to a charge state of the battery satisfying a reference condition;
detecting a second reference time point in response to second charge state information related to the charge state of the battery satisfying the reference condition; and
detecting an internal short of the battery based on a difference between a charge amount from the first reference time point to the second reference time point and a discharge amount from the first reference time point to the second reference time point.

20. The method of claim 19, further comprising:
acquiring the first charge state information related to the charge state of the battery; and
acquiring the second charge state information related to the charge state of the battery.

21. The method of claim 19, wherein the internal short is detected in response to determining that the difference between the charge amount and the discharge amount being equal to or more than a threshold value.

22. The method of claim 19, wherein each of the first charge state information and the second charge state information comprises one or more of a temperature value of the battery, a current value of the battery, a voltage value of the battery, and/or a state of charge (SOC) of the battery.

23. The method of claim 19, wherein the first reference condition comprises one or more of a reference current value, a reference voltage value, a full charge condition of the battery, and/or a reference state of charge (SOC).

24. The method of claim 19, wherein the second reference time point is detected in response to a current value of the battery in the second charge state information being equal to or less than a reference current value and a voltage value of the battery in the second charge state information being equal to or more than a reference voltage value.

25. The method of claim 19, further comprising:
determining whether the first charge state information and the second charge state information are within a predetermined range of each other, wherein the internal short is detected in response to the first charge state information and the second charge state information being similar to each other within the predetermined range.

26. The method of claim 19, further comprising:
determining whether at least one of the charge amount and the discharge amount is equal to or more than a predetermined value, wherein the internal short is detected in response to at least one of the charge amount and the discharge amount being equal to or more than the predetermined value.

27. The method of claim 19, further comprising:
determining whether a time interval between the first reference time point and the second reference time point is within a threshold range, wherein the internal short is detected in response to the time interval being within the threshold range.

28. The method of claim 19, further comprising:
start accumulating a charge current amount supplied from a charging device to the battery and a discharge current amount supplied from the battery to a load in response to the first reference time point bring detected, wherein accumulation of the charge current amount and the discharge current amount ends in response to detecting the second reference time point.

29. The method of claim 28, further comprising:
calculating the charge amount and the discharge amount based on the accumulated charge current amount and the discharge current amount between the first reference time point and the second reference time point, in response to the second reference time point being detected.

30. The method of claim 29, further comprising:
resetting the accumulated charge current amount and the discharge current amount in response to the charge amount and the discharge amount being calculated.

* * * * *